(12) United States Patent
Gu et al.

(10) Patent No.: US 7,885,078 B2
(45) Date of Patent: Feb. 8, 2011

(54) ELECTRICAL CARD

(75) Inventors: Hao Gu, Kunshan (CN); Qi-Sheng Zheng, Kunshan (CN); Zhi-Quan Mou, Kunshan (CN); Xiao-Hai Zhou, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 921 days.

(21) Appl. No.: 11/796,580

(22) Filed: Apr. 27, 2007

(65) Prior Publication Data

US 2007/0253174 A1    Nov. 1, 2007

(30) Foreign Application Priority Data

Apr. 27, 2006 (CN) .................... 2006 2 0073089 U

(51) Int. Cl.
*H05K 1/14* (2006.01)

(52) U.S. Cl. ...................................... 361/737; 361/752

(58) Field of Classification Search ................. 361/727, 361/737, 760, 752, 790, 797, 800, 753, 816, 361/818, 679.01, 748, 784, 796, 724; 439/55, 439/64, 60, 59, 607.01, 131, 159, 152, 946

See application file for complete search history.

(56) References Cited

U.S. PATENT DOCUMENTS

| 6,849,801 B2 | 2/2005 | Tung et al. |
| 6,853,550 B2 | 2/2005 | Tseng et al. |
| 7,019,980 B2 * | 3/2006 | Gu .............................. 361/737 |
| 7,075,792 B2 * | 7/2006 | Tseng et al. ................. 361/737 |
| 2004/0252466 A1 * | 12/2004 | Bor-Ren ...................... 361/737 |

* cited by examiner

*Primary Examiner*—Hung S Bui
(74) *Attorney, Agent, or Firm*—Wei Te Chung; Andrew C. Cheng; Ming Chieh Chang

(57) ABSTRACT

An electrical card (100) includes an insulative frame (1) having a pair of detachable side bars (112) spaced from each other and a transverse bar (116) assembled onto the side bars to interconnect the side bars; a detachable upper cover (12) attached to a rear end of the frame; an upper shell (2) and a lower shell (3) mounted to an upper side and a lower side of the side bars respectively; a detachable lower cover (4) attached to the lower shell and disposed beneath the upper cover; a circuit board (5) supported by the frame and located between the frame and the upper shell; and an electrical connector (6) attached to a front end of the frame and electrically connected to the circuit board.

17 Claims, 10 Drawing Sheets

ELECTRICAL CARD

BACKGROUND OF THE INVENTION

1. Field of the Invention

The present invention generally relates to an electrical card, and particularly to an electrical card which can be manufactured efficiently.

2. Description of Related Art

Electrical cards are widespread, such as PC cards, also known as data card or IC cards, are available according to standards of the PCMCIA (Personal Computer Memory Card International Association). A conventional PC card as disclosed in U.S. Pat. No. 6,849,801 typically comprises an insulative frame, a connector mounted on a front end of the insulative frame, an upper shell and a lower shell mounted onto an upper side and a lower side of the insulative frame respectively, a circuit board supported by the insulative frame. The frame includes a pair of longitudinal side bars, a transverse bar interconnecting the side bars, and a plate-like cover formed integrally with the side bars. Since the side bars are spaced a long distance from each other, and the length of each side bar is big, the overall dimension of the frame becomes so large that a corresponding mold for making the frame is designed to include less cavities, thus less frames are formed during every molding process, and the production efficiency is definitely decreased.

The cover of the PC card tends to be modified due to various requirements of customers, and the cover may be made separately and then assembled with the upper and lower shell. Such conventional PC card as disclosed in U.S. Pat. No. 6,853,550 comprises an upper shell, a lower shell engaging with the upper shell, an insulative frame including a transverse bar with two short side bars projecting from opposite ends thereof, two covers detachable from the transverse bar and being secured to the upper shell and the lower shell respectively, a connector mounted on a front end of the frame, and a circuit board electrically connected to the connector. However, both the upper shell and the lower shell are made of metal material and define position protrusions and connection holes for locking with each other directly, the locking engagement therebetween may not be reliable due to certain clearances between the position protrusions and the connection holes. Furthermore, the circuit board is disposed on the short side bars and the cover at a front end and a rear end thereof respectively, the circuit board is likely to move under sudden vibrations or distortions, thus making the electrical connection between the circuit board and the connector broken.

It is thus desired to provide an improved card to overcome the shortcomings described above.

SUMMARY OF THE INVENTION

An object of the present invention is to provide an electrical card which can be manufactured efficiently.

Another object of the present invention is to provide an electrical card having a circuit board retained therein reliably.

In order to achieve above-mentioned object, an electrical card comprises an insulative frame comprising a pair of detachable side bars spaced from each other and a transverse bar assembled onto the side bars to interconnect the side bars; a detachable upper cover attached to a rear end of the frame; an upper shell and a lower shell mounted to an upper side and a lower side of the side bars respectively; a detachable lower cover attached to the lower shell and disposed beneath the upper cover; a circuit board supported by the frame and located between the frame and the upper shell; and an electrical connector attached to a front end of the frame and electrically connected to the circuit board.

Other objects, advantages and novel features of the present invention will become more apparent from the following detailed description of the present embodiment when taken in conjunction with the accompanying drawings.

DETAILED DESCRIPTION OF THE INVENTION

Figure 1:
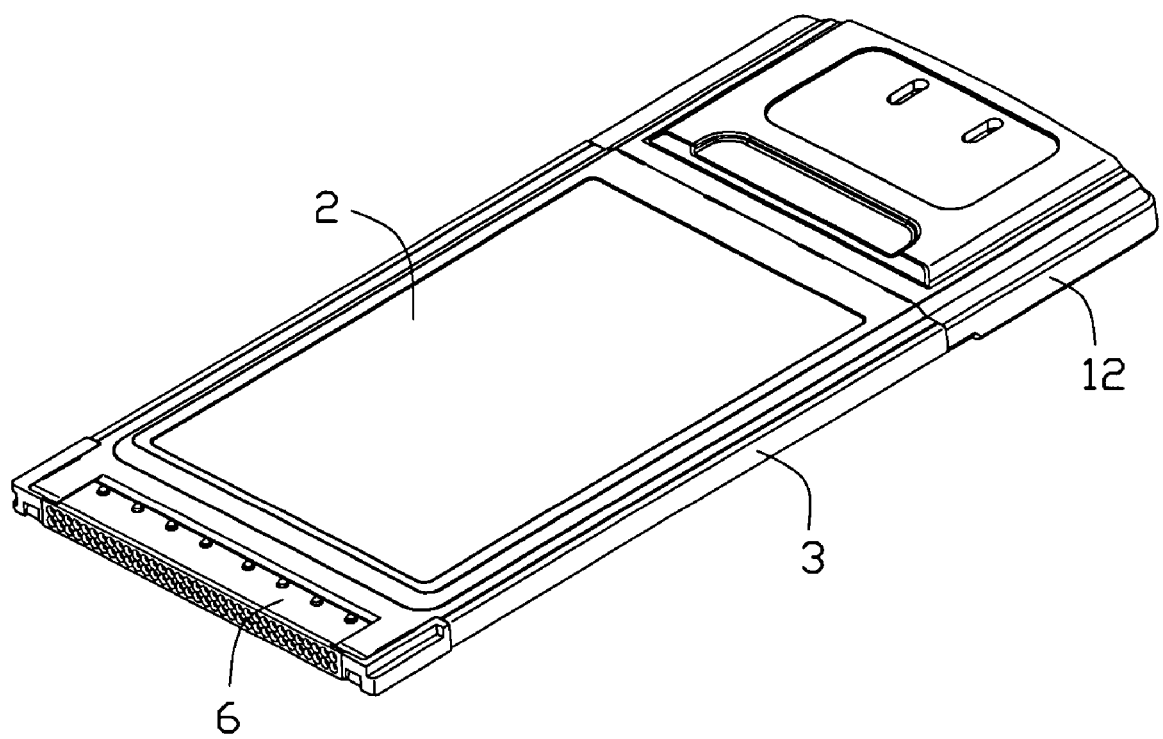
FIG. 1 is an assembled perspective view of an electrical card according to the present invention.

Reference will now be made to the drawing figures to describe the preferred embodiment of the present invention in detail.

Figure 2:
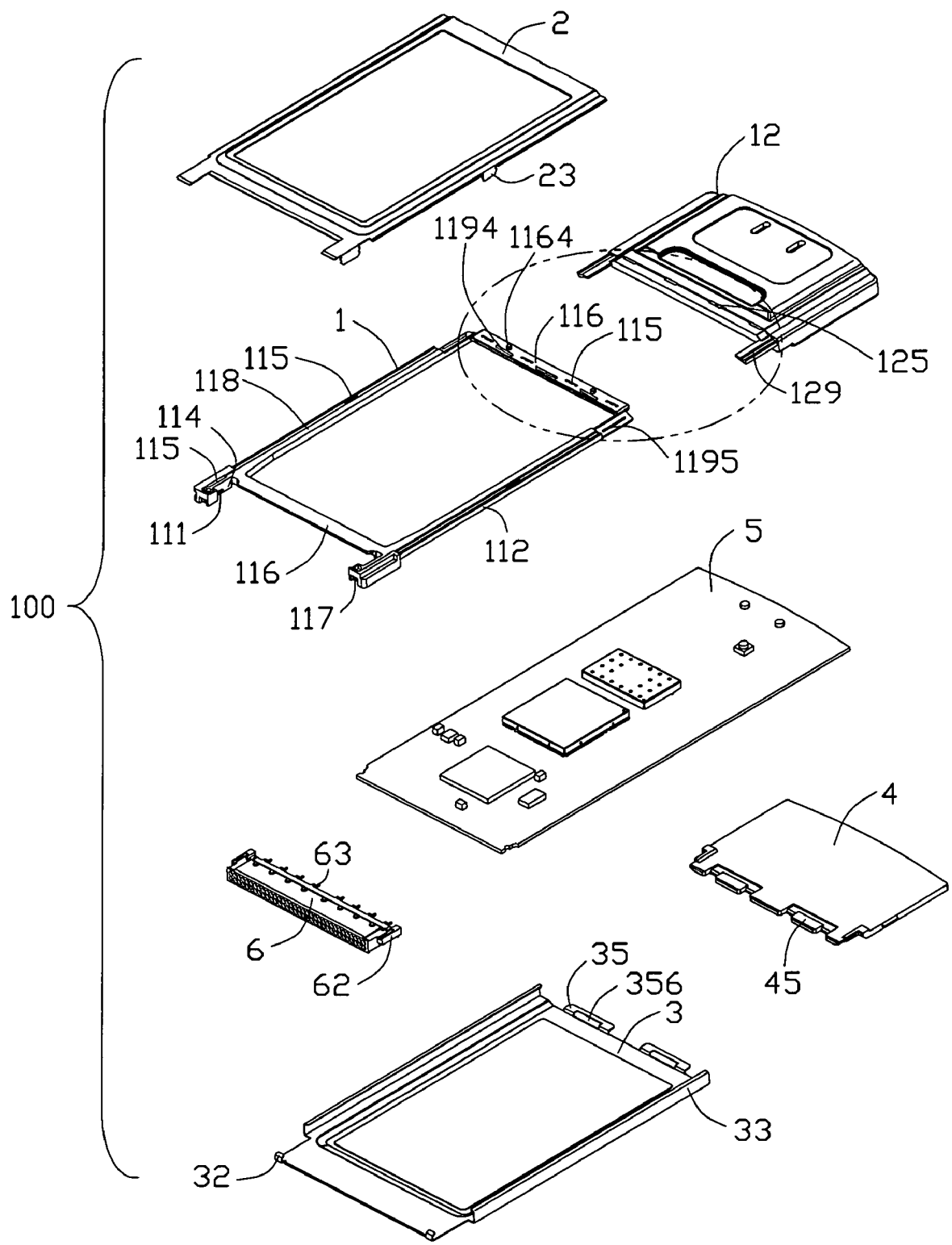
FIG. 2 is an exploded perspective view of the electrical card of FIG. 1.
Figure 3:
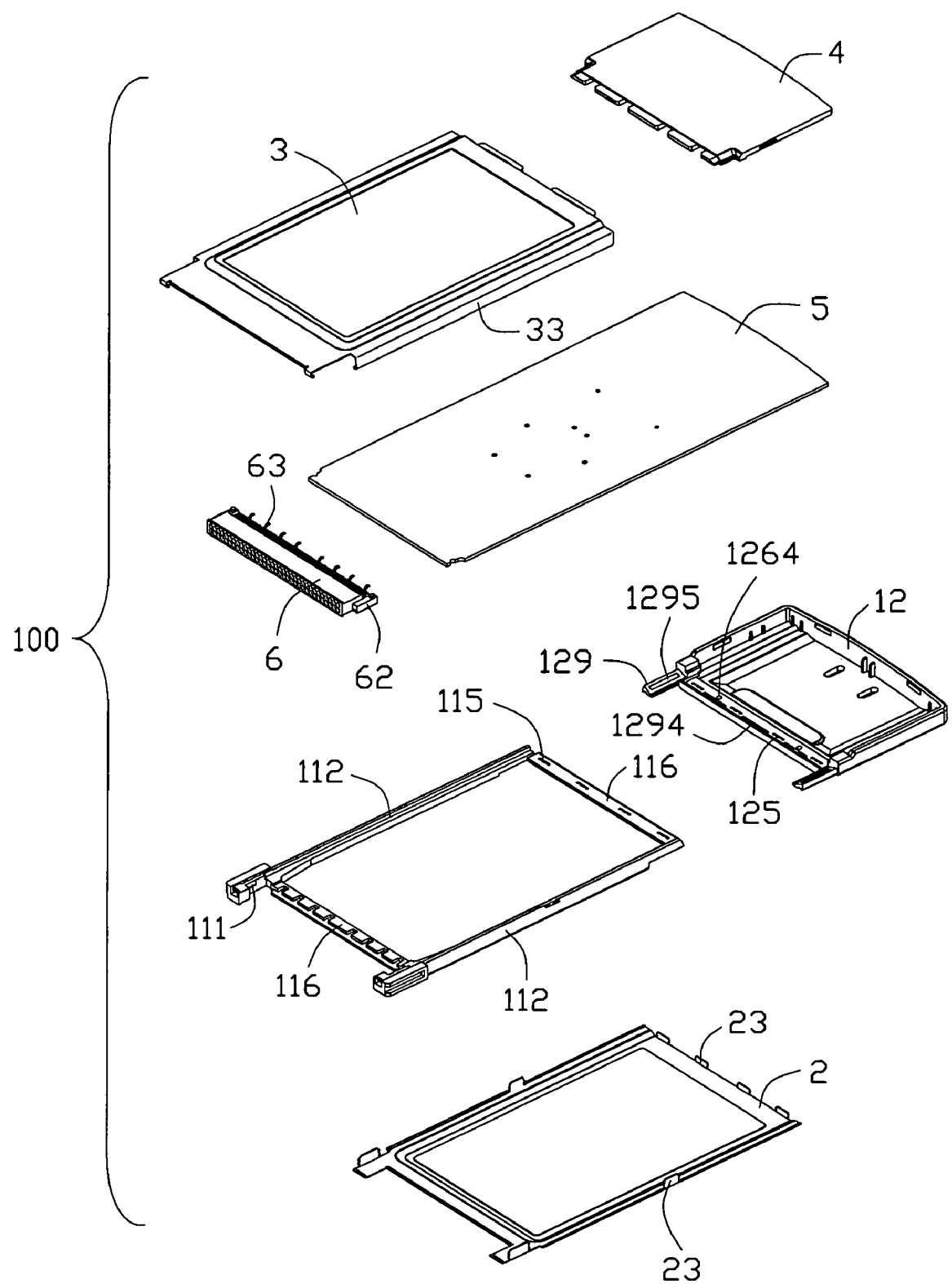
FIG. 3 is a view similar to FIG. 2, while taken from a different aspect.
Figure 4:
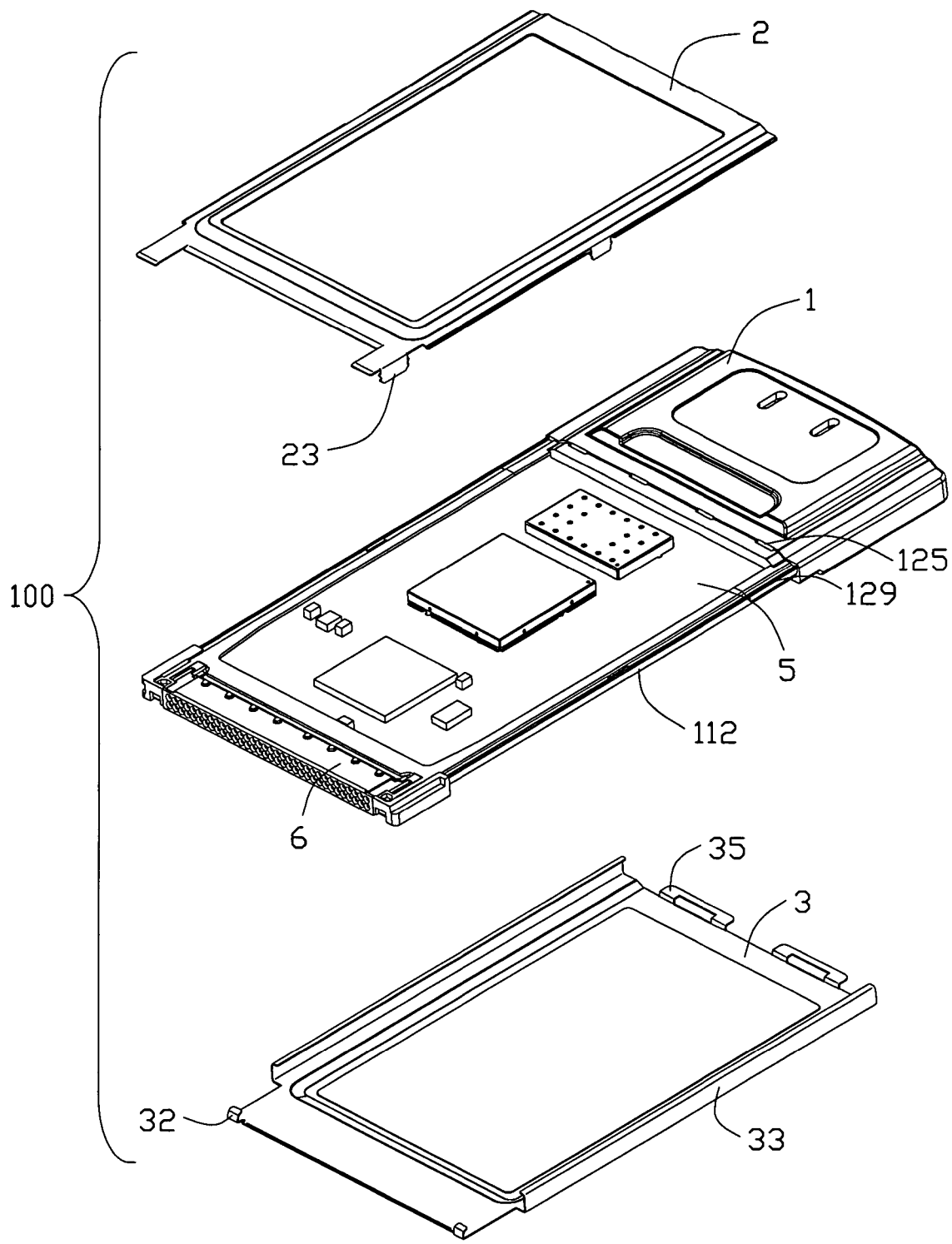
FIG. 4 is a partially assembled perspective view of the electrical card.
Figure 5:
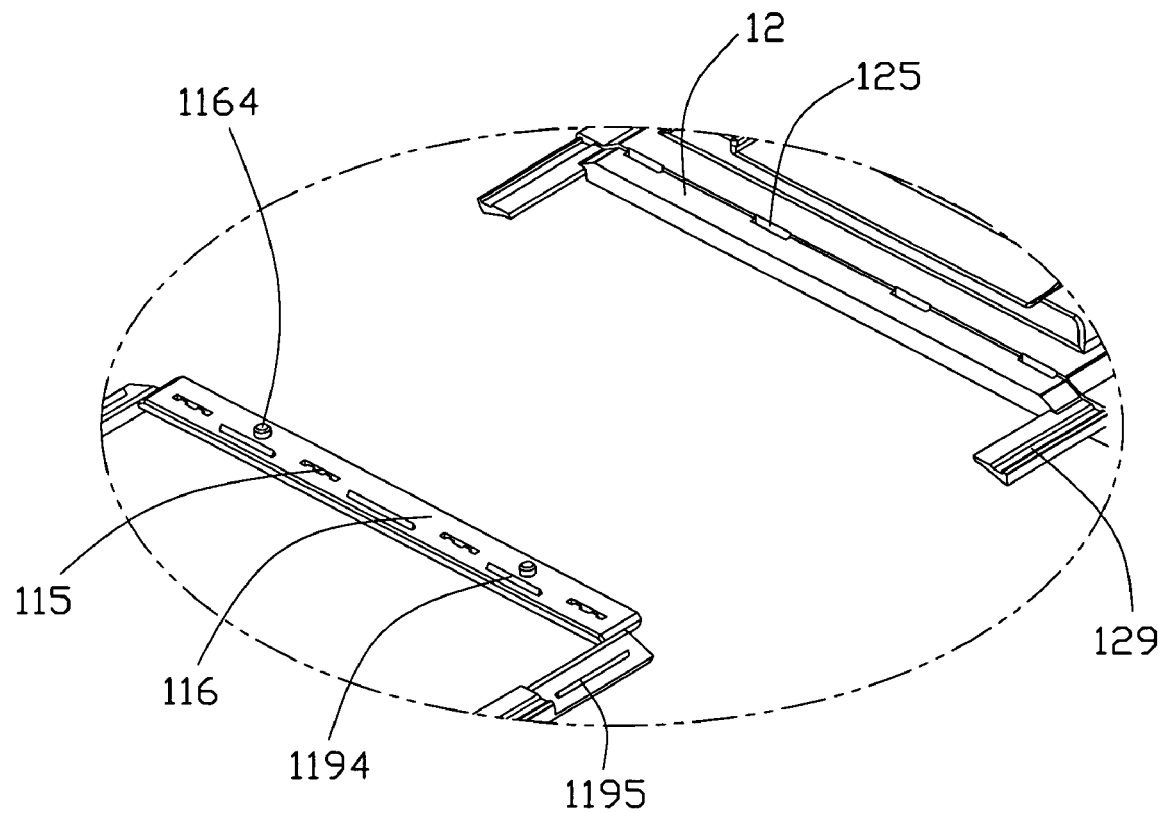
FIG. 5 is a partially enlarged view taken from a dotted-line circle of FIG. 2.
Figure 6:
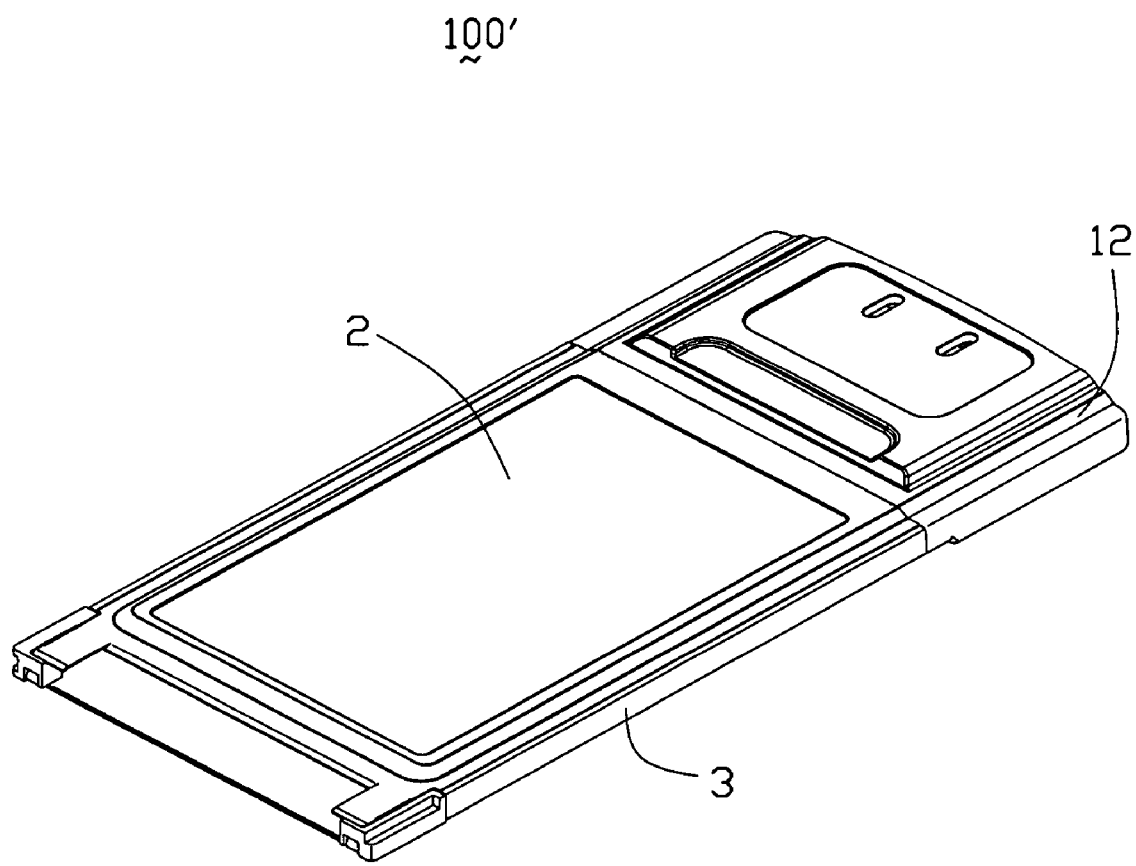
FIG. 6 is an assembled perspective view of a second embodiment of the electrical card.
Figure 7:
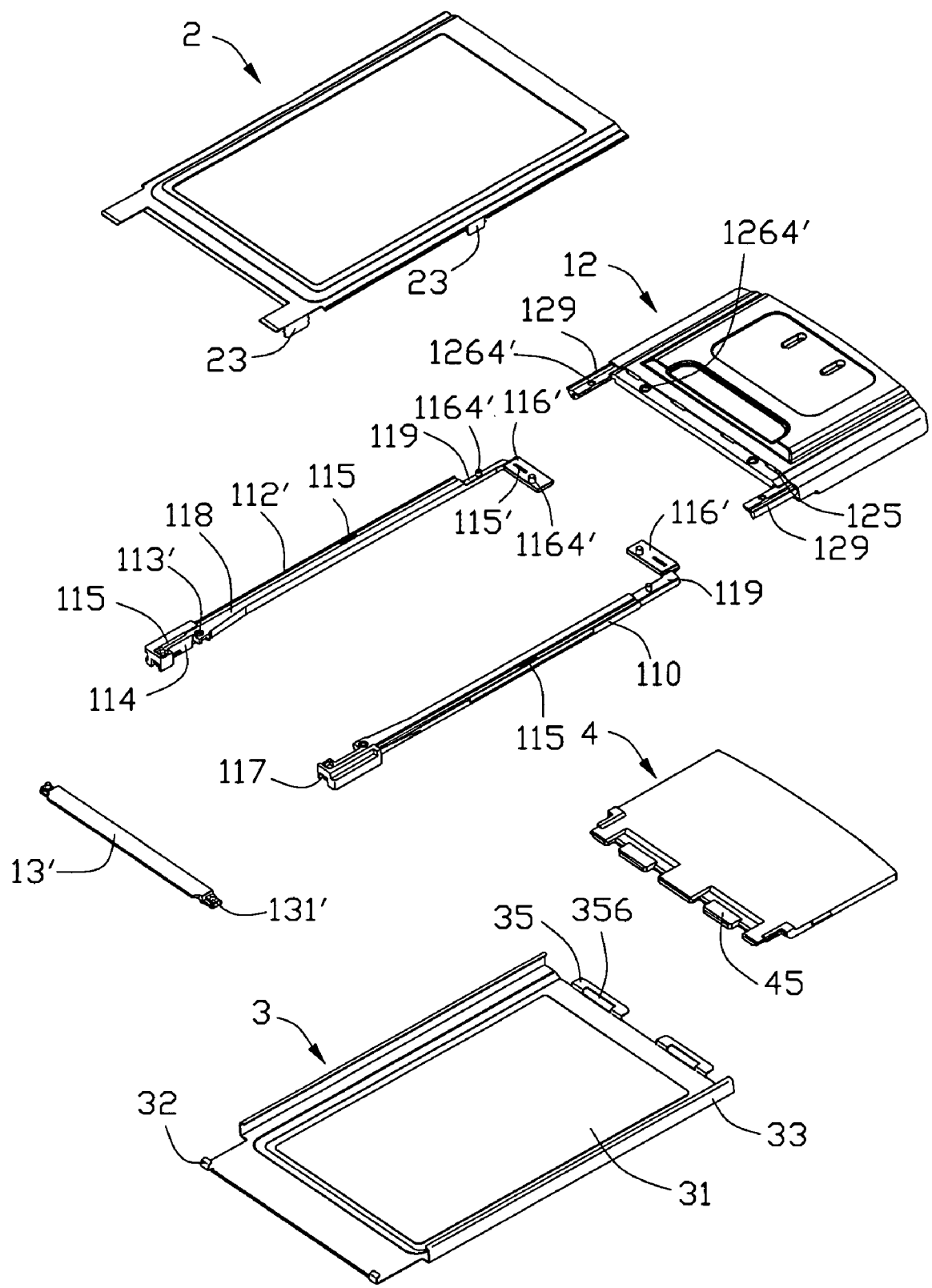
FIG. 7 is an exploded perspective view of the electrical card of FIG. 6.
Figure 8:
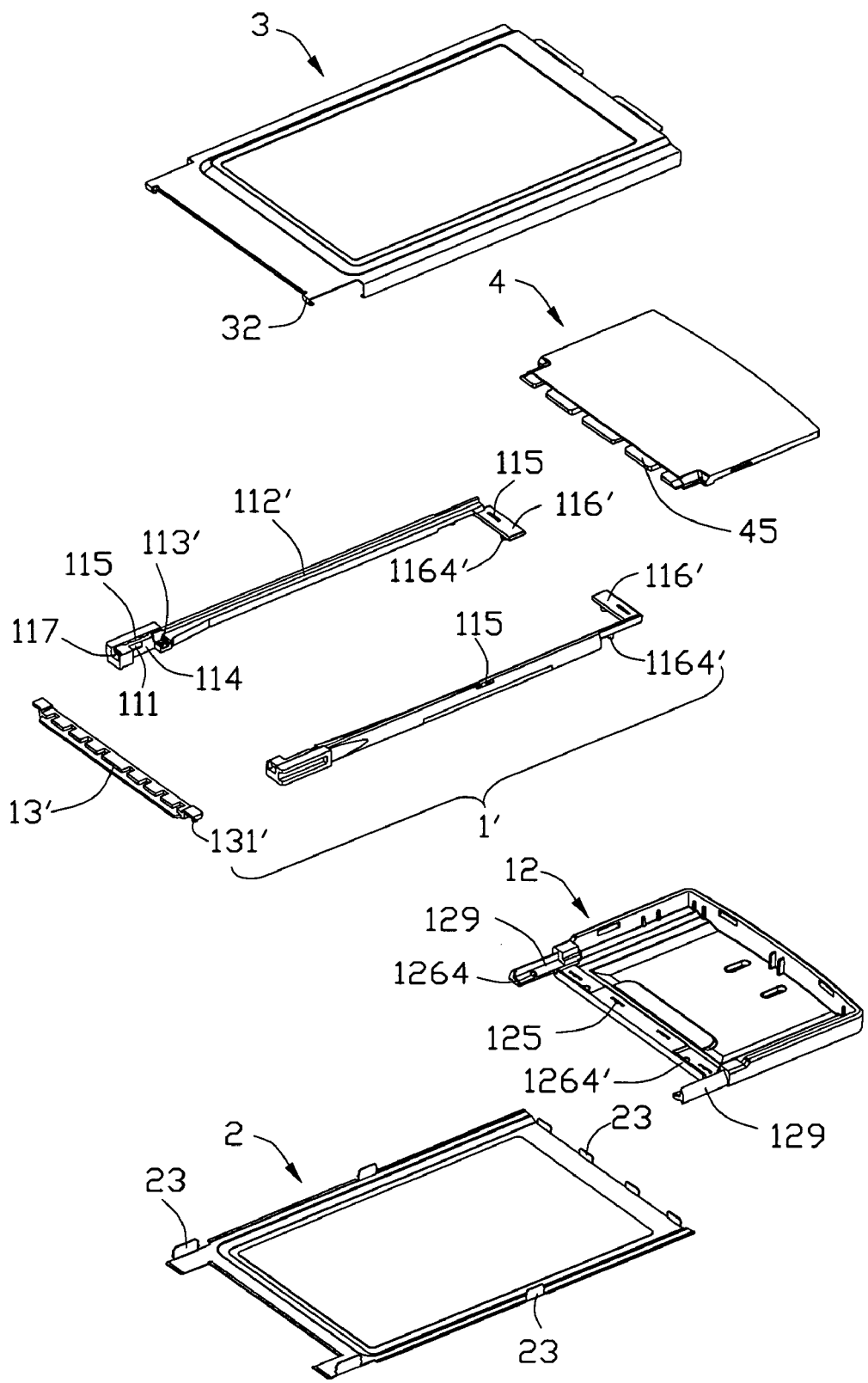
FIG. 8 is a view similar to FIG. 7, while taken from a different aspect.
Figure 9:
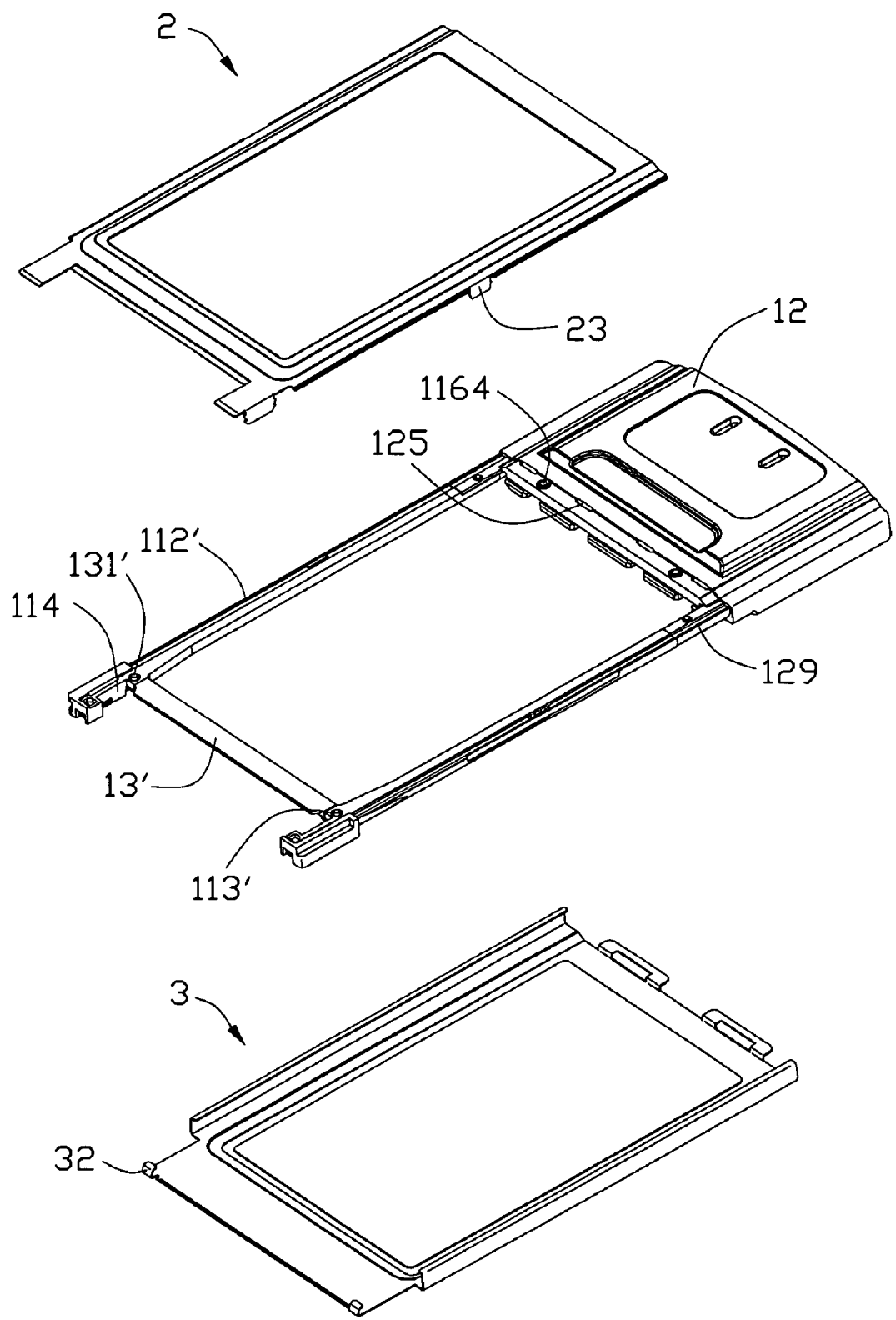
FIG. 9 is a partially assembled perspective view of the electrical card of FIG. 7.
Figure 10:
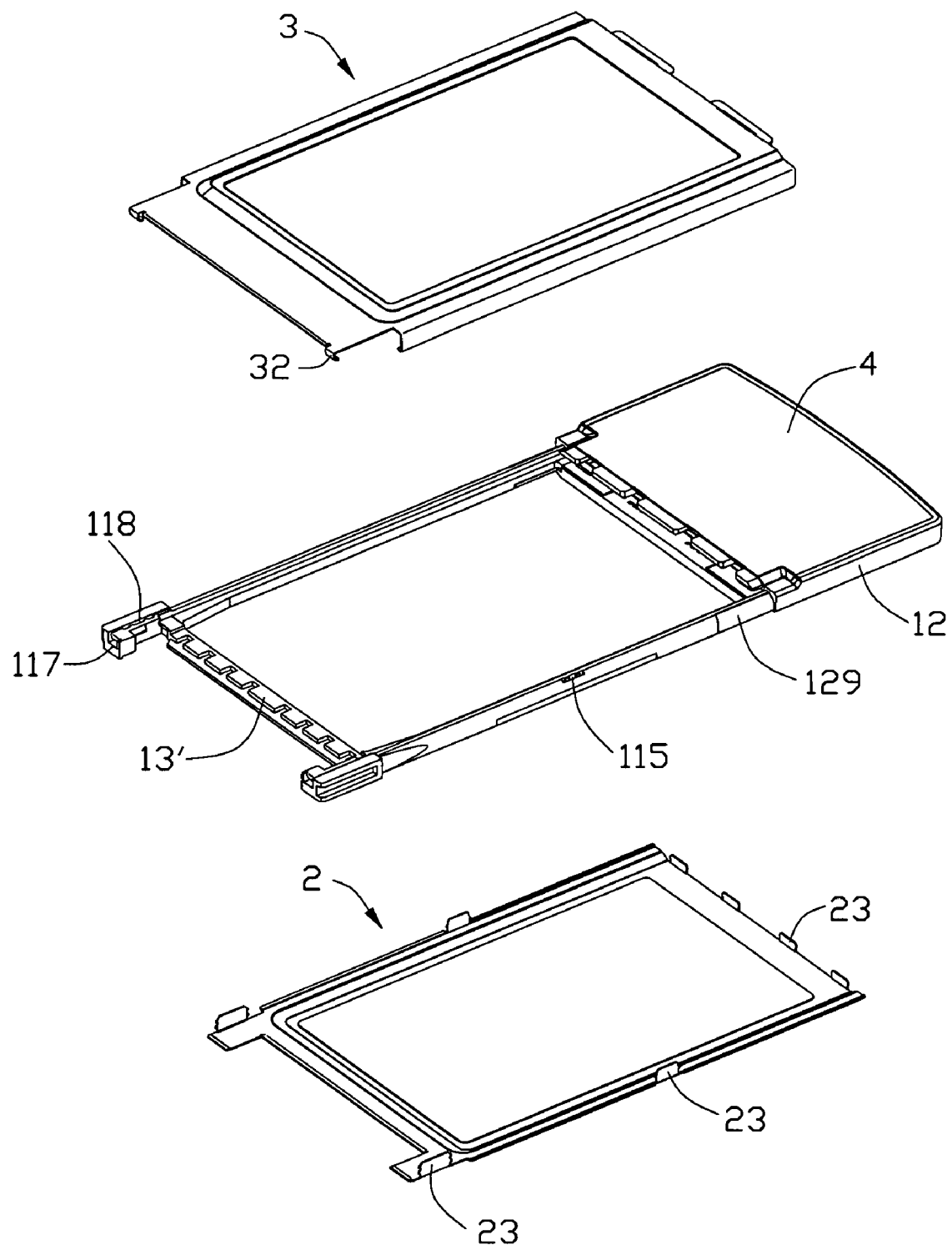
FIG. 10 is a view similar to FIG. 9, while taken from a different aspect.

Referring to FIGS. 1 and 2, an electrical card 100 according to the present invention comprises a rectangular insulative frame 1 including a pair of elongated side bars 112, a pair of transverse bars 116 interconnecting said side bars 112, an upper cover 12 attached to a rear end of the side bars 112 and a lower cover 4 cooperating with the upper cover 12 to form a space for receiving an antenna (not shown) therein.

The card connector 100 further comprises an upper metal shell 2 and a lower metal shell 3 mounted on an upper side and a lower side of the insulative frame 1 respectively, the upper shell 2 is made of sheet metal and defines a plurality of barbs 23 extending perpendicularly from side edges, a front end and a rear end thereof, said barbs 23 are adapted to cut into a corresponding latching hole 115 provided on the insulative frame 1. The lower shell 3 defines a latch 32 in a front end thereof for locking with a retaining passage 117 extending from a front side surface of the side bars 112, a mounting wall 33 bent upwardly and then inwardly to envelop outward surfaces of the side bars 112 and to clamp top side edges of the upper shell 2. A rear end of the lower shell 3 is provided with a pair of retention tabs 35 including a fixing hole 356, a protrusion 45 is formed on the front end of the lower cover 4 to interferentially lock with the fixing hole 356.

The side bars 112 defines a pair of receiving passages 114 in a front end thereof for accommodating an electrical connector 6 therebetween. A fixing tab 111 is provided on an inner side wall of the receiving passages 114 for abutting against a corresponding side flange 62 of the connector 6. The side bars 112 each has an inner recessed portion 118 cooperating with the front transverse bar 116 to define a plane for supporting a circuit board 5 in a widthwise direction and a lengthwise direction of the frame 1. Said circuit board 5 is sandwiched between the side bars 112 and connected to contacts 63 formed on the connector 6.

The rear transverse bar 116 includes a pair of columnar post 1164 extending upwardly from a substantially middle portion therefrom, the upper cover 12 has a position hole 1264 for retaining the corresponding columnar post 1164. A number of channels 125 are formed on a front end of the upper cover 12 to align with corresponding latching holes 115 of the rear transverse bar 116 in an up-to-down direction, thus allowing the barbs 23 of the upper shell 2 to pass therethrough and secure the upper cover 12 to the transverse bar 116. In order to achieve more desirable retention effect, the transverse bar 116 further has a number of projections 1194 to be retained in corresponding recesses 1294 of the upper cover 12; the rear end of the side bars 112 is thinner than other portions of the side bars 112, a position tab 1195 is provided on the rear end of the side bar 112, the upper cover 12 comprises a position arm 129 projecting forwardly therefrom, a position aperture 1295 is provided on the position arm 129 for fixing the position tab 1195. In addition, ultrasonic welding, thermal glue may be used to enhance engagement between the upper cover 12 and the side bars 112.

The card connector 100 is assembled as follows, the lower cover 4 is fixed on the lower shell 3 firstly, then the upper cover 12 is attached to the insulative frame 1 and stacked on the rear transverse bar 116 and the rear end of the side bars 112. Thereafter, the connector 6 is positioned between the receiving passages 114, the side bars 112 abuts against side edges of the circuit board 5 such that the circuit board 5 is sandwiched therebetween, a lower side of the circuit board 5 is supported by the side bars 112 and the transverse bar 116, the contacts 63 of the connector 6 are soldered onto the circuit board 5 to establish electrical connections therebetween. The barbs 23 of the upper shell 2 are retained in the latching holes 115 of the side bars 112 and the transverse bar 116, and the channels 125 of the upper cover 12 respectively, thereby the upper shell 2 is attached to the frame 1, and the upper shell 2 cooperates with the frame 1 to biases an upper side and a lower side of the circuit board 5 respectively. Finally, the latches 32 are fixed in the retaining passages 117 of the side bars 112, the mounting wall 33 envelops outward surfaces of the side bars 112 and clamps the top side of the upper shell 2.

FIGS. 6-10 show another embodiment of the electrical card connector 100', which differs from the above described card connector 100 in the insulative frame, the insulative frame 1' of the card connector 100' is designed as three detachable sections, which are a pair of side bars 112' and a transverse bar 13', the side bars 112' each defines a aperture 113' for retaining a post 131' formed on opposite ends of the transverse bar 13'. A end bar 116' extends laterally from a rear end of the side bar 112' to lock with the upper cover 12, a latching hole 115 is provided on the end bar 116' to align with channels 125 of the upper cover 12, therefore, barbs 23 of the upper shell 2 are secured in the latching holes 115 and the channels 125, the upper cover 12 is attached to the side bars 112'. A plurality of retaining posts 1164' are provided on the end bar 116' and the side bars 112' to be retained in the position hole 1264 of the upper cover 12 respectively. Since the insulative frame 1' is formed as three separate portions, a corresponding mold for manufacturing the insulative frame 1' is capable of having a plurality of cavities, thus increasing the production efficiency and decreasing manufacturing cost.

Both the upper cover 12 and the lower cover 4 are detachable from the insulative frame 1', it is convenient to modify said upper cover 12 and the lower cover 4 in response to various requirements, without the need of changing the insulative frame 1', that means cards of various types can be manufactured with less product lines. On the other hand, side edges of the circuit board 5 are retained by the elongated side bars 112 along a lengthwise direction of the insulative frame 1, and sandwiched between the upper shell 2 and the insulative frame 1 in a vertical direction perpendicular to the lengthwise direction, therefore, the circuit board 5 is fixed securely between the insulative frame 1, the upper shell 2 and the lower shell 3, thus ensuring reliable electrical connection between the connector 6 and the circuit board 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical card comprising:
    an insulative frame comprising a pair of detachable side bars which are made separately and spaced from each other and a transverse bar assembled onto the side bars to interconnect the side bars;
    a detachable upper cover attached to a rear end of the frame to abut downwardly against the side bars and the transverse bar;
    an upper shell and a lower shell mounted to an upper side and a lower side of the side bars respectively;
    a detachable lower cover attached to the lower shell and disposed beneath the upper cover;
    a circuit board supported by the insulative frame and located between the frame and the upper shell; and
    an electrical connector attached to a front end of the frame and electrically connected to the circuit board.

2. The electrical card as claimed in claim 1, wherein the side bars each defines a recessed portion extending along a lengthwise direction of the side bars, and located on inner sides thereof to be coplanar with the transverse bar, the circuit board is located on the recessed portion and the transverse bar and sandwiched between the side bars.

3. The electrical card as claimed in claim 1, wherein the upper cover defines a pair of position arms extending forwardly therefrom to be attached to rear ends of the side bars.

4. The electrical card as claimed in claim 3, wherein the position arms are coplanar with the side bars.

5. The electrical card as claimed in claim 3, wherein the rear ends of the side bar are thinner than other portions of the side bar, a position tab is formed on the rear end of the side bar, and the position arm defines a position aperture to lock with the position tab.

6. The electrical card as claimed in claim 1, wherein the frame defines a plurality of latching holes, the upper shell defines a plurality of barbs locked within corresponding latching holes.

7. The electrical card as claimed in claim 1, wherein the transverse bar has a plurality of latching holes, the upper cover has a plurality of channels aligned with the corresponding latching holes respectively, the upper shell defines a plurality of bars retained within the channels and the latching holes.

8. The electrical card as claimed in claim 1, wherein the transverse bar defines a columnar post, the upper cover has a position hole to receive the columnar post.

9. The electrical card as claimed in claim 1, wherein the side bars each has a receiving passages and a fixing tab, the connector has a pair of flanges on opposite sides thereof, the flanges is received in the receiving passages and abutting against the position tab.

10. An electrical card, comprising:
- an insulative frame comprising a pair of elongated side bars and a transverse bar interconnecting the side bars;
- a detachable upper cover attached to the side bars along a lengthwise direction of the frame and attached to the transverse bar along a width direction of the frame;
- an upper shell and a lower shell mounted to an upper side and a lower side of the frame respectively;
- a detachable lower cover cooperating with the upper cover to define a space therebetween and attached to the lower shell;
- a circuit board disposed on the frame along a length and a width direction thereof and retained between the frame and the upper shell in an upper-to-down direction; and
- an electrical connector attached to the frame and electrically connected to the circuit board.

11. The electrical card as claimed in claim 10, wherein the side bars each defines a recessed portion extending along a lengthwise direction of the side bars, and located on inner sides thereof to be coplanar with the transverse bar, the circuit board is located on the recessed portion and the transverse bar and sandwiched between the side bars.

12. The electrical card as claimed in claim 10, wherein the upper cover defines a pair of position arms extending forwardly therefrom to be attached to rear ends of the side bars, a position tab is formed on the rear end of the side bar, and the position arm defines a position aperture to lock with the position tab, the transverse bar has a number of projections to be retained in corresponding recesses formed on the upper cover.

13. An connector comprising:
- an insulative frame;
- an insulative first cover fastened to a front end of the insulative frame;
- a metallic first shell having a similar configuration with the frame and positioned above a face of the frame, and including a fastening device attached to at least one of the first cover and the frame so as to retain the first shell to the assembled frame and first cover;
- an insulative second cover having a similar configuration with the first cover;
- a metallic second shell having a similar configuration with the first shell and latched to the second cover; and
- an extended printed circuit board having one surface supported by the frame and the other one facing one of said first shell and said second shell, and having a similar configuration with either the assembled first cover and first shell or the assembled second cover and second shell; wherein the second shell defines clamps grasping a periphery of said frame; wherein
- both said first cover and said second cover are discrete from the frame and separately formed with regard to the frame.

14. The connector as claimed in claim 13, wherein the frame includes a pair of L-shaped structures.

15. The connector as claimed in claim 13, wherein the frame defines a rectangular configuration.

16. The connector as claimed in claim 13, wherein an electrical connector is located at one end of the frame opposite to the other end where the first cover is attached.

17. The connector as claimed in claim 13, wherein the first cover is attached to the front end of the frame along both lengthwise and transverse directions which are perpendicular to each other.

* * * * *